US012812963B2

(12) United States Patent
Lee et al.

(10) Patent No.: US 12,812,963 B2
(45) Date of Patent: Nov. 24, 2026

(54) INTEGRATED CIRCUIT DEVICE AND METHOD FOR MANUFACTURING THE SAME

(71) Applicant: Samsung Electronics Co., Ltd., Suwon-si (KR)

(72) Inventors: Jinwoo Lee, Suwon-si (KR); Hojun Choi, Suwon-si (KR); Sutae Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 436 days.

(21) Appl. No.: 18/500,636

(22) Filed: Nov. 2, 2023

(65) Prior Publication Data

US 2024/0274598 A1 Aug. 15, 2024

(30) Foreign Application Priority Data

Feb. 15, 2023 (KR) ........................ 10-2023-0020344

(51) Int. Cl.

| | |
|---|---|
| ***H10D 84/40*** | (2025.01) |
| ***H10D 10/40*** | (2025.01) |
| ***H10P 52/40*** | (2026.01) |
| ***H10W 20/20*** | (2026.01) |
| ***H10W 20/42*** | (2026.01) |

(52) U.S. Cl.

CPC ......... *H10D 84/401* (2025.01); *H10D 10/421* (2025.01); *H10P 52/402* (2026.01); *H10W 20/20* (2026.01); *H10W 20/42* (2026.01)

(58) Field of Classification Search

CPC ....... H10D 12/441–491; H10D 62/116; H10D 84/40–409; H10D 84/80–87; H10D 87/00; H10P 90/1902

See application file for complete search history.

(56) References Cited

U.S. PATENT DOCUMENTS

| | | | |
|---|---|---|---|
| 8,987,878 B2 | 3/2015 | Feng et al. | |
| 9,236,433 B2 | 1/2016 | Pala et al. | |
| 10,002,836 B2 | 6/2018 | Spitzlsperger et al. | |
| 10,115,652 B2 | 10/2018 | Numabe et al. | |
| 10,593,759 B2 | 3/2020 | Yilmaz et al. | |
| 2018/0166324 A1* | 6/2018 | Schaeffer ............ | H10P 90/1912 |
| 2021/0193836 A1 | 6/2021 | Guha et al. | |
| 2022/0216330 A1 | 7/2022 | Su et al. | |

* cited by examiner

*Primary Examiner* — Daniel P Shook

(74) *Attorney, Agent, or Firm* — Harness, Dickey & Pierce, P.L.C.

(57) ABSTRACT

The present disclosure relates to an integrated circuit element and a manufacturing method thereof. An integrated circuit element may include a substrate including a first region and a second region, a first element in the first region of the substrate and configured to generate an electric field in a horizontal direction, and a second element in the second region of the substrate and configured to generate an electric field is formed in a vertical direction, wherein a thickness of the second region of the substrate is thicker than a thickness of the first region.

13 Claims, 21 Drawing Sheets

INTEGRATED CIRCUIT DEVICE AND METHOD FOR MANUFACTURING THE SAME

CROSS-REFERENCE TO RELATED APPLICATION

This application claims priority to and the benefit of Korean Patent Application No. 10-2023-0020344 filed in the Korean Intellectual Property Office on Feb. 15, 2023, the entire contents of which are incorporated herein by reference.

BACKGROUND

1. Field

The present disclosure relates to integrated circuit elements and manufacturing methods thereof.

2. Description of the Related Art

A semiconductor is a material that is included in an intermediate region between a conductor and an insulator, and means a material that conducts electricity under predetermined conditions. Various semiconductor devices may be manufactured using the semiconductor material, and for example, memory devices and the like may be manufactured. Such a semiconductor device may be used in various electronic devices.

A semiconductor device may be formed on a substrate, and one substrate may be divided into several regions. In this case, an element for generating an electric field in a horizontal direction may be formed in some regions of the substrate, and an element for forming an electric field in a vertical direction may be formed in another part of the substrate. After forming various elements on the front surface of the substrate, a thinning process may be performed on the back surface of the substrate. As the thickness of the substrate becomes thinner through the thinning process, a part of the device where the electric field is formed in the vertical direction is damaged, and performance may be deteriorated.

SUMMARY

Some example embodiments provide integrated circuit elements that can mitigate or prevent degradation of performance of some elements, and/or manufacturing methods thereof.

An integrated circuit element according to an example embodiment may include a substrate including a first region and a second region, a first element that in the first region of the substrate and configured to generate an electric field in a horizontal direction, and a second element in the second region of the substrate and configured to generate an electric field in a vertical direction, wherein a thickness of the second region is thicker than a thickness of the first region.

An integrated circuit element according to an example embodiment may include a substrate including a first region and a second region, a first element on the first region of the substrate, and a second element on the second region of the substrate, wherein the first region and the second region of the substrate have different thicknesses.

A manufacturing method of an integrated circuit element according to an example embodiment may include forming a first element in a first region of a substrate and forming a second element in a second region of the substrate, positioning a carrier substrate to face an upper surface of the substrate and attaching the substrate to the carrier substrate; reducing a thickness of the substrate by performing a wafer thinning process on a bottom surface of the substrate; and forming a dummy region on a bottom surface of the second region of the substrate to increase a thickness of the second region of the substrate.

According to some example embodiments, degradation of performance of some devices can be mitigated or prevented by making the thickness of the substrate dual (e.g., by making thickness of the substrate to be different based on the devices provided thereon).

DETAILED DESCRIPTION

Figure 1:
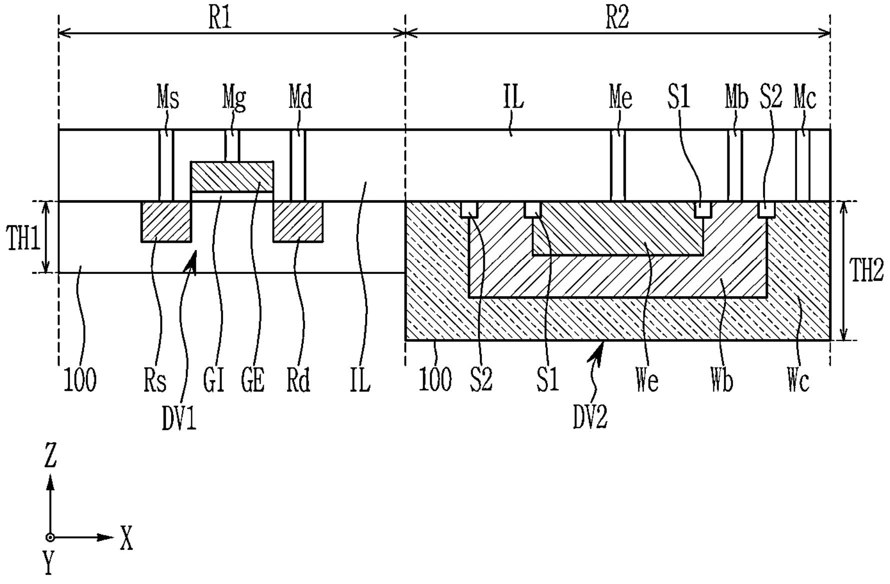
FIG. 1 is a cross-sectional view of an integrated circuit element according to an example embodiment.

Hereinafter, with reference to accompanying drawings, various example embodiments of the present disclosure will be described in detail such that a person of an ordinary skill can easily practice them in the technical field to which the present inventive concepts belong. The present disclosure may be embodied in many different forms and is not limited to the example embodiments described herein. Accordingly, the drawings and description are to be regarded as illustrative in nature and not restrictive. Like reference numerals designate like elements throughout the specification.

In addition, because the size and thickness of each component shown in the drawing is arbitrarily shown for convenience of explanation, the present disclosure is not necessarily limited to the drawing. In the drawings, the thickness of layers, films, panels, regions, etc., are exaggerated for clarity. In addition, in the drawing, for convenience of explanation, the thickness of some layers and regions is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

Hereinafter, an integrated circuit element according to an example embodiment will be described with reference to FIG. 1.

FIG. 1 is a cross-sectional view of an integrated circuit element according to an example embodiment.

As shown in FIG. 1, an integrated circuit element according to an example embodiment includes a substrate 100 including a first region R1 and a second region R2, a first element DV1 positioned in the first region R1 of the substrate 100, and a second element DV2 positioned in the second region R2 of the substrate 100.

The substrate 100 may include a semiconductor material. For example, the substrate 100 may include a group IV semiconductor, a group III-V compound semiconductor, a group II-VI compound semiconductor, and the like. For example, the substrate 100 may include a semiconductor such as Si or Ge, or a compound semiconductor such as SiGe, SiC, GaAs, InAs, or InP. The substrate 100 may have a top surface parallel to a first direction (X direction) and a second direction (Y direction), and a thickness parallel to a third direction (Z direction) that is perpendicular to the first direction (X direction) and the second direction (Y direction).

The substrate 100 may include a plurality of regions, for example, the first region R1 and the second region R2. Elements having different characteristics may be disposed in the first region R1 and the second region R2. For example, elements generating an electric field in a horizontal direction may be disposed in the first region R1, and elements generating an electric field in a vertical direction may be disposed in the second region R2.

A first element DV1 disposed in the first region R1 of the substrate 100 may be formed of, for example, a metal oxide semiconductor field effect transistor (MOSFET). The first element DV1 includes a source region Rs and a drain region Rd formed in the first region R1 of the substrate 100. The source region Rs and the drain region Rd may be spaced apart from each other. Upper surfaces of the source region Rs and the drain region Rd may be flat with the upper surface of the substrate 100. A gate insulation layer GI may be disposed on the substrate 100, and a gate electrode GE may be disposed on the gate insulation layer GI. On a plane (e.g., when viewed in a plan view), the gate electrode GE may be disposed between the source region Rs and the drain region Rd.

The first element DV1 may be formed of an N-channel metal oxide semiconductor field effect transistor or a P-channel metal oxide semiconductor field effect transistor. When first element DV1 is formed of an N-channel metal oxide semiconductor field effect transistor, the source region Rs and the drain region Rd may be high-concentration doped with N-type. In this case, the first region R1 of the substrate 100 is a body and may be formed as a P-type. When the first element DV1 is formed of a P-channel metal oxide semiconductor field effect transistor, the source region Rs and drain region Rd may be high-concentration doped with P-type. In this case, the first region R1 of the substrate 100 is a body and may be formed as N-type.

An insulation layer IL may be disposed on the first element DV1 to cover the first element DV1. A hole passing through the insulation layer IL may be formed in the insulation layer IL, and wirings may be formed to fill the inside of the hole. For example, a gate wire Mg connected to the gate electrode GE may be formed through the insulation layer IL. A first wire Ms connected to the source region Rs and a second wire Md connected to the drain region Rd may be formed through the insulation layer IL. Although not shown, an insulation layer, a wiring layer, and the like may be additionally formed on the gate wire Mg, the first wire Ms, and the second wire Md.

A second element DV2 disposed in the second region R2 of the substrate 100 may be formed of, for example, a bipolar junction transistor (BJT). The second element DV2 may include a first well region We, a second well region Wb, and a third well region Wc formed in the second region R2 of the substrate 100. The first well region We may be surrounded by the second well region Wb. Side and bottom surfaces of the first well region We may be surrounded by the second well region Wb. The second well region Wb may be surrounded by the third well region Wc. Side and bottom surfaces of the second well region Wb may be surrounded by the third well region Wc. Therefore, the third well region Wc may have the widest width and the deepest depth. The first well region We may have the narrowest width and the shallowest depth.

Planar shapes of the first well region We, the second well region Wb, and the third well region Wc will now be described in detail with reference to FIG. 2.

Figure 2:
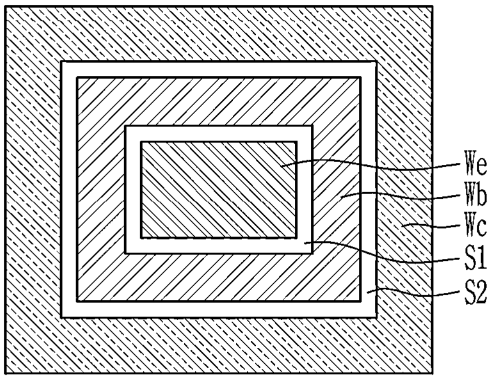
FIG. 2 is a top plan view of a part of the integrated circuit element according to an example embodiment.

FIG. 2 is a top plan view of a part of the integrated circuit element according to an embodiment. FIG. 2 shows the second region of the substrate in the integrated circuit element according to an embodiment.

As shown in FIG. 2, the first well region We, the second well region Wb, and the third well region Wc may be formed as approximate quadrangles on a plane. However, the planar shapes of the first well region We, the second well region Wb, and the third well region Wc are not limited thereto and may be variously changed. For example, the first well region We, the second well region Wb, and the third well region Wc may have a substantially circular or elliptical shape on a plane. The first well region We may be surrounded by the second well region Wb, and the second well region Wb may be surrounded by the third well region Wc.

The first well region We may serve as an emitter, the second well region Wb may serve as a base, and the third well region Wc may serve as a collector. The second element DV2 may include a PNP-type transistor or an NPN-type transistor. When the second element DV2 is formed of a PNP-type transistor, the first well region We and the third well region Wc may be doped as a P-type. In this case, the second well region Wb may be doped as an N-type. When the second element DV2 is formed of an NPN-type transistor, the first well region We and the third well region Wc may be doped as an N-type. In this case, the second well region Wb may be doped as a P-type.

A first element isolation region S1 may be disposed between the first well region We and the second well region Wb. The first element isolation region S1 may be formed to surround the first well region We on a plane. The first element isolation region S1 is shown to be formed only in a portion adjacent to upper surfaces of the first well region We and the second well region Wb, but is not limited thereto. The first element isolation region S1 may be formed to a deeper position. A second element isolation region S2 may be disposed between the second well region Wb and the third well region Wc. The second element isolation region S2 may be formed to surround the second well region Wb on a plane. The second element isolation region S2 is shown to be formed only in a portion adjacent to the upper surfaces of the second well region Wb and the third well region Wc, but is not limited thereto. The second element isolation region S2 may be formed to a deeper position.

The insulation layer IL may be disposed on the first well region We, the second well region Wb, and the third well region Wc. Although the insulation layer IL disposed in the first region R1 and the second region R2 is shown as being integrally formed, but is not limited thereto. The insulation layer IL disposed in the first region R1 and the insulation layer IL disposed in the second region R2 may be separated from each other and may be formed of different materials in different processes.

A hole passing through the insulation layer IL may be formed in the insulation layer IL, and wirings may be formed to fill the inside of the hole. For example, an emitter wire Me connected to the first well region We may be formed through the insulation layer IL. A base wire Mb connected to the second well region Wb may be formed through the insulation layer IL. A collector wire Mc connected to the third well region Wc may be formed through the insulation layer IL. Although not shown, an insulation layer, a wiring layer, and the like may be additionally formed on the emitter wire Me, the base wire Mb, and the collector wire Mc.

As described above, the first element DV1 may be formed of a metal oxide semiconductor field effect transistor, and may use one type of carrier (e.g., a hole or an electron). In a metal oxide semiconductor field effect transistor, a carrier may move in a horizontal direction, and an electric field may be formed in a horizontal direction on the substrate 100. The type of first element DV1 is not limited thereto, and may be formed of other elements forming a horizontal direction electric field. Such a first element DV1 may form a logic cell. The logic cell may include a plurality of circuit elements such as transistors and registers, and may have a function of performing various logic functions. For example, logic cells may be formed of AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OAI(OR/AND/INVERTER), AO(AND/OR), AOI(AND/OR/INVERTER), a D flip-flop, a reset flip-flop, a master-slave flip-flop, a latch, or a combination thereof.

The second element DV2 may be formed of a bipolar junction transistor, and may use two types of carriers (e.g., holes and electrons). In the bipolar junction transistor, the carrier may move in a vertical direction, and an electric field may be formed in a vertical direction on the substrate 100. The type of the second element DV2 is not limited thereto, and may be formed of other elements in which a vertical direction electric field is formed. For example, the second element DV2 may include a vertical diode, an electrostatic discharge (ESD), and the like.

The first region R1 and the second region R2 of the substrate 100 at which the first element DV1 and the second element DV2 having different characteristics as described above are respectively disposed may have different thicknesses. A thickness TH2 of the second region R2 of the substrate 100 may be thicker than a thickness TH1 of the first region R1. For example, the thickness TH1 of the first region R1 of the substrate 100 may be greater than or equal to about 200 nm and less than or equal to about 300 nm. The thickness TH2 of the second region R2 of the substrate 100 may be about 500 nm or more and about 1 μm or less. The thickness TH2 of the second region R2 of the substrate 100 may preferably be about 600 nm or more.

An element that forms an electric field in a vertical direction may be disposed in the second region R2 of the substrate 100. Therefore, a bulk body may be formed and the performance of the second element DV2 can be improved by forming the thickness TH2 of the second region R2 of the substrate 100 sufficiently thick. An element that forms an electric field in a horizontal direction may be disposed in the first region R1 of the substrate 100. Therefore, although the thickness TH1 of the first region R1 of the substrate 100 is formed relatively thin, the performance of the first element DV1 may not be affected. Recently, a back-side power delivery network (BSPDN) method in which logic cells are formed on a front side of the substrate 100 and wiring or signal routing wiring is disposed on a back side of the substrate 110 to deliver power to the logic cell is used. In order to connect wiring disposed on the back side of the substrate 100 with an element disposed on the front side of the substrate 100, a through-silicon via (TSV) passing through the substrate 100 may be used. In the integrated circuit element according to an example embodiment, the through-silicon via may be easily formed and a back-side power delivery network method can be easily implemented by forming the thickness TH1 of the first region R1 of the substrate 100 relatively thin. That is, the efficiency of the element disposed in each region may be improved or maximized by forming the thickness of the substrate 100 differently depending on positions.

Hereinafter, referring to FIG. 3, a structure of the semiconductor element formed in the first region of the substrate by applying the back-side power delivery network method will be further described.

Figure 3:
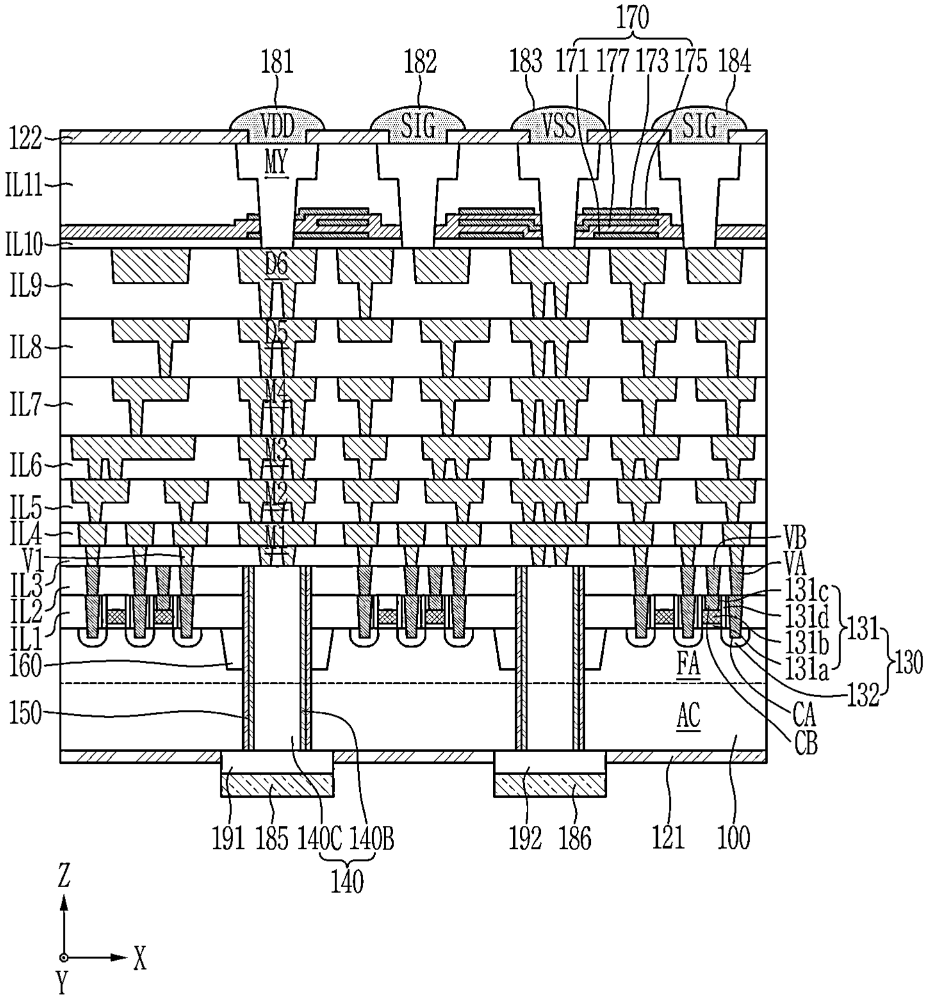
FIG. 3 is a cross-sectional view of some region of an integrated circuit element according to an example embodiment.

FIG. 3 is a cross-sectional view of some region of an integrated circuit element according to an example embodiment.

As shown in FIG. 3, an integrated circuit element according to an example embodiment includes a substrate 100, a plurality of transistors 130 disposed on the substrate 100, a plurality of metal layers M1, M2, M3, M4, D5, D6, and MY, and a through via 140 that penetrates the substrate 100.

An isolation layer 160 and an active region AC defined by the isolation layer 160 may be formed on the substrate 100. A plurality of fin-type active regions FA on the active region AC may protrude in a third direction (Z direction).

A plurality of gate structures 131 may be disposed on the fin-type active region FA. Source/drain regions 132 may be disposed on both sides of the plurality of gate structures 131, and they may form the transistor 130. The transistor 130 may be formed of a metal oxide semiconductor field effect transistor. Each transistor 130 may have a three-dimensional structure in which a channel is formed on an upper surface and both side walls of the plurality of fin-type active regions FA.

Each of the plurality of gate structures 131 may include a gate insulation layer 131*a*, a gate line 131*b*, a gate insulation spacer 131*d*, and a gate insulation capping layer 131*c*.

A plurality of gate insulation layers 131*a* may include a silicon oxide, a high dielectric material, or a combination thereof. The high dielectric material may include a material having a higher dielectric constant than a silicon oxide. For example, a plurality of gate insulation layers 131*a* may have a dielectric constant of about 10 to 25. The high dielectric material may include a metal oxide or a metal oxynitride. For example, the high dielectric material may include a material selected from a hafnium oxide, a hafnium oxynitride, a hafnium silicon oxide, a lanthanum oxide, a lanthanum aluminum oxide, a zirconium oxide, a zirconium silicon oxide, a tantalum oxide, a titanium oxide, and a combination thereof. However, this is not restrictive. An interface layer may be interposed between the fin-type active region FA and the gate insulation layer 131*a*. The interface layer may include an oxide, a nitride, or an oxynitride.

A plurality of gate lines 131*b* may have a structure in which a metal nitride layer, a metal layer, a conductive capping layer, and a gap-fill metal layer are sequentially stacked. The metal nitride layer and the metal layer may include at least one metal selected from Ti, Ta, W, Ru, Nb, Mo, and Hf. The gap-fill metal layer may include a W film or an Al film. The plurality of gate lines 131*b* may each include a work function metal-containing layer. The work function metal-containing layer may include at least one metal selected from Ti, W, Ru, Nb, Mo, Hf, Ni, Co, Pt, Yb, Tb, Dy, Er, and Pd. In some embodiments, the plurality of gate lines 131*b* has a stacking structure of TiAlC/TiN/W, a stacking structure of TiN/TaN/TiAlC/TiN/W, or a stacking structure of TiN/TaN/TiN/TiAlC/TiN/W, respectively, but this but is not restrictive.

A gate insulation spacer 131*d* may be disposed on both sidewalls of each of the plurality of gate lines 131*b*. The gate insulation spacer 131*d* may cover both sidewalls of each of the plurality of gate lines 131*b*. The gate insulation spacer 131*d* may extend parallel to the gate line 131*b* along a first direction (X direction) that is a length direction of the gate line 131*b*. The gate insulating spacer 131*d* may include a silicon nitride. In some example embodiments, a plurality of gate insulation spacers 131*d* may include a material having a smaller dielectric constant than silicon nitride, for example, SiOCN, SiCN, or a combination thereof.

A top surface of each of the plurality of gate lines 131*b* may be covered by the gate insulating capping layer 131*c*. A plurality of gate insulation capping layers 131*c* may include a silicon nitride. The plurality of gate insulation capping layers 131*c* may overlap the gate line 131*b* in a third direction (Z direction) and extend parallel to the gate line 131*b*. Side surfaces of the plurality of gate insulating capping layers 131*c* may be covered by the gate insulating spacers 131*d*.

The source/drain region 132 may be disposed on the plurality of fin-type active regions FA. A pair of source/drain regions 132 may be formed on both sides of each of the plurality of gate lines 131*b*. The gate line 131*b* and the source/drain region 132 may be spaced apart from each other with the gate insulation layer 131*a* with the gate insulation spacer 131*d* interposed therebetween.

The source/drain region 132 may include an impurity ion injection region formed in a portion of the fin-type active region FA, a semiconductor epitaxial layer epitaxially grown from a plurality of recess regions formed in the fin-type active region FA, or a combination thereof. The plurality of source/drain regions 132 may include an epitaxially grown Si layer, an epitaxially grown SiC layer, or an epitaxially grown plurality of SiGe layers.

When the transistor 130 is an NMOS transistor, the plurality of source/drain regions 132 may include an epitaxially grown Si layer or an epitaxially grown SiC layer, and may include an N-type impurity. When the transistor 130 is a PMOS transistor, the plurality of source/drain regions 132 may include an epitaxially grown SiGe layer and may include a P-type impurity.

At least some of the plurality of source/drain regions 132 may be covered by a first insulation layer IL1. The first insulation layer IL1 may include an insulating material such as a silicon oxide or phosphosilicate glass (PSG), but is not limited thereto.

A plurality of source/drain contacts CA may be formed on the plurality of pin-type active regions FA. The plurality of source/drain contacts CA may each extend in a direction crossing the plurality of pin-type active regions FA. The plurality of source/drain contacts CA may each contact the plurality of source/drain regions 132.

A plurality of source/drain vias VA contacting each of the plurality of source/drain contacts CA may be formed on each of the plurality of source/drain contacts CA.

A plurality of gate contacts CB may be formed on each of the plurality of gate structures 131. The plurality of gate contacts CB may pass through the gate insulation capping layer 131*c* and be connected to one of the gate lines 131*b*. The plurality of gate contacts CB may be disposed between a pair of source/drain contacts CA.

A plurality of gate vias VB contacting each of the plurality of gate contacts CB may be formed on each of the plurality of gate contacts CB.

The second insulation layer IL2 may cover the first insulation layer IL1 and a gate insulation capping layer 131*c*. The second insulation layer IL2 may include a silicon oxide. For example, the second insulation layer IL2 may include, but is not limited to, tetraethyl orthosilicate (TEOS), or an ultra low K (ULK) material having an ultra low dielectric constant K of about 2.2 to 2.4. The ULK material may include SiOC or SiCOH.

According to some example embodiments, the plurality of source/drain contacts CA and the plurality of gate contacts CB may include a barrier layer formed of titanium (Ti), tantalum (Ta), a titanium nitride (TiN), a tantalum nitride (TaN), or a combination thereof and a conductive layer formed of Co, W, or a combination thereof. In some cases, a silicide layer may be disposed between the barrier layer and the source/drain region 132. The silicide layer may include, for example, tungsten silicide (WSi), titanium silicide (TiSi), cobalt silicide (CoSi), or nickel silicide (NiSi).

Third to eleventh insulation layers IL3 to IL11 sequentially stacked on the second insulation layer IL2 may be formed on the second insulation layer IL2. The third to eleventh insulation layer IL3 to IL11 may include a low dielectric material such as a spin on dielectric (SOD).

According to some example embodiments, an etching stop layer made of a material such as SiC may be interposed between two adjacent layers of the first to eleventh insulation layers IL1 to IL12.

A via V1 may be formed in the third insulation layer IL3, a metal layer M1 may be formed in the fourth insulation layer IL4, a metal layer M2 may be formed in the fifth insulation layer IL5, a metal layer M3 may be formed in the sixth insulation layer IL6, a metal layer M4 may be formed in the seventh insulation layer IL7, a metal layer D5 may be formed in the eighth insulation layer IL8, and a metal layer D6 may be formed in the ninth insulation layer IL9. A metal layer MY may be formed in the tenth insulation layer IL10 and the eleventh insulation layer IL11. The metal layers M1, M2, M3, M4, D5, D6, and MY may be formed by a back end of line (BEOL) process and may be configured to be electrically connected to each other.

According to some example embodiments, A barrier layer formed of titanium (Ti), tantalum (Ta), a titanium nitride (TiN), a tantalum nitride (TaN), or a combination thereof and having a conformal shape may be disposed between the plurality of metal layers M1, M2, M3, M4, D5, D6, and MY and the third to eleventh insulation layers IL3 to IL11.

According to some example embodiments, the conductive via V1 and the metal layer M1 in the third and fourth insulation layers IL3 and IL4 are formed through separate processes, and the metal layers M2, M3, M4, D5, D6, and MY are shown as being formed through a dual damascene process, but are not limited thereto. For example, a conductive via and a conductive pattern formed by a separate process is formed on each of the third to eleventh insulation layers IL3 to IL11, or a metal layer formed by a dual damascene process is formed on each of the third to eleventh insulation layers IL3 to IL11.

The metal layer MY may serve as a pad, and external connection terminals 181, 182, 183, and 184 such as solder may be disposed on the metal layer MY. A power voltage VDD may be applied to the connection terminal 181, a signal SIG generated from a logic cell may be transmitted through the connection terminals 182 and 184, and a ground potential VSS may be applied to the connection terminal 183.

An upper surface of the eleventh insulation layer IL11, a portion of the metal layer MY, and side surfaces of the external connection terminals 181, 182, 183, and 184 may be covered by the protective layer 122. The protective layer 122 may include, for example, an insulating polymer.

Each of the through vias 140 may extend in a third direction (Z direction) to penetrate the substrate 100. The bottom surface of each of the through vias 140 may be made flat with the bottom surface of the substrate 100, and the top surface of each through-via 140 may be made flat with the top surface of the second insulation layer IL2.

Each of the through vias 140 may be formed between a Front End of Line (FEOL) process and a Back End of Line (BEOL) process. That is, each through via 140 may be formed by a via middle process. The through vias 140 may further penetrate the first and second insulation layers IL1 and IL2, respectively. However, it is not limited thereto, and the through vias 140 may be formed before the FEOL process or after the BEOL process.

Through vias 140 include a barrier layer 140B including titanium (Ti), tantalum (Ta), a titanium nitride (TiN), and a tantalum nitride (TaN) and a conductive layer 140C including tungsten (W), aluminum (Al), and copper (Cu). The barrier layers 140B may each have a conformal shape, and the conductive layers 140C may fill the inside of the barrier layers 140B.

Additional insulation layers 150 may be interposed between the through via 140 and the substrate 100 and between the through via 140 and the first and second insulation layers IL1 and IL2. Each of the insulation layers 150 may have a conformal shape.

A noise blocking element 170 may be disposed between the tenth insulation layer IL10 and the eleventh insulation layer IL11. The noise blocking element 170 may include sequentially stacked first to third electrodes 171, 173, and 175 and a dielectric layer 177 interposed between the sequentially stacked first to third electrodes 171, 173, and 175. The noise blocking element 170 may be a capacitor. In some cases, the noise blocking element 170 may be omitted.

The first to third electrodes may contain conductive materials such as metal or doped semiconductors. The dielectric layer 177 may include a high dielectric material. The high dielectric material may include a material having a higher dielectric constant than a silicon oxide. For example, a plurality of gate dielectric layers 177 may have a dielectric constant of about 10 to 25. The high dielectric material may include a metal oxide or a metal oxynitride. The dielectric layer 177 may provide high capacitance to the noise blocking element 170 while insulating the first to third electrodes 171, 173, and 175 from each other.

The through via 140 to which the power voltage VDD is applied and a pad 191 may contact each other, and the through via 140 to which a ground voltage VSS is applied and a pad 192 may contact each other. Portions of the bottom surface of the substrate 100 on which the pads 191 and 192 are not formed may be covered by the protective layer 121. The protective layer 121 covering the bottom surface of the substrate 100 may include the same material as the protective layer 122 covering the upper surface of the eleventh insulation layer IL11. Connection terminals 185 and 186 may be formed on each of the pads 191 and 192.

In the above, the transistor formed in the first region of the substrate has been described as having a fin field effect transistor (FinFET) structure, but is not limited thereto. For example, the transistor may be formed of not only a FinFET structure in which three sides of the channel are surrounded by gate electrodes, but also a gate all around (GAA) and a multi bridge channel field effect transistor (MBCFET) structures in which four sides of the channel are surrounded by gate electrodes and the like. Further, the transistor may be formed of a 3D stack field effect transistor (3DSFET) structure, a complementary field effect transistor (CFET) structure, and the like to which a next-generation technology is applied.

Hereinafter, referring to FIG. 4 to FIG. 6, various variations of transistors that can be formed in a first region of a substrate of an integrated circuit element according to an embodiment will be described.

Figure 4:
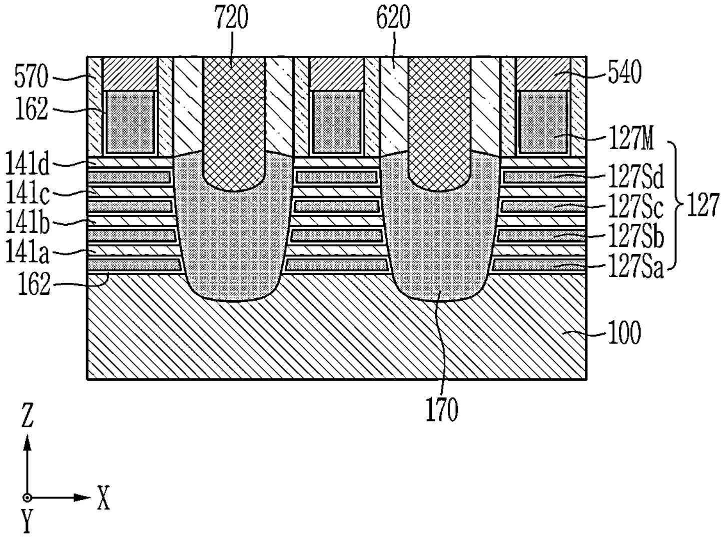
FIG. 4 to FIG. 6 are cross-sectional views of some region of an integrated circuit element according to some example embodiments.
Figure 5:
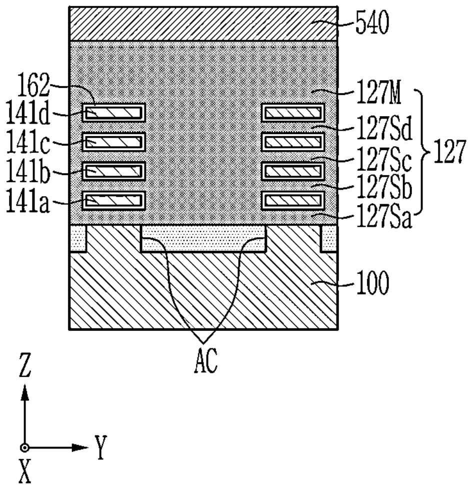
Figure 6:
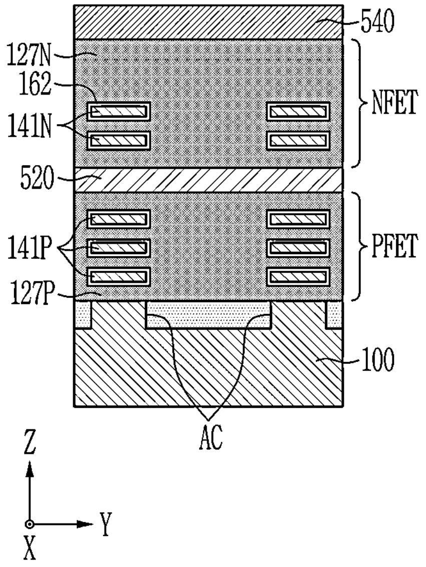

FIG. 4 to FIG. 6 are cross-sectional views of some region of an integrated circuit element according to some example embodiments.

First, referring to FIG. 4 and FIG. 5, an integrated circuit element according to an example embodiment may include a substrate 100, a plurality of channel patterns 141*a*, 141*b*, 141*c*, and 141*d* disposed on an active region AC of the substrate 100, source/drain patterns 170 disposed at opposite sides of the channel patterns 141*a*, 141*b*, 141*c*, and 141*d*, and gate electrodes 127 surrounding the channel patterns 141*a*, 141*b*, 141*c*, and 141*d*.

The plurality of channel patterns 141*a*, 141*b*, 141*c*, and 141*d* may include a first channel pattern 141*a*, a second channel pattern 141*b*, a third channel pattern 141*c*, and a fourth channel pattern 141*d*.

The gate electrode 127 may include a main gate electrode 127M and a plurality of sub-gate electrodes 127Sa, 127Sb, 127Sc, and 127Sd. The plurality of sub-gate electrodes 127Sa, 127Sb, 127Sc, and 127Sd may include a first sub-gate electrode 127Sa, a second sub-gate electrode 127Sb, a third sub-gate electrode 127Sc, and a fourth sub-gate electrode 127Sd.

The plurality of channel patterns 141*a*, 141*b*, 141*c*, and 141*d* and the gate electrode 127 may have a structure in which they are alternately stacked. A first channel pattern 141*a*, a second sub-gate electrode 127Sb, a second channel pattern 141*b*, a third sub-gate electrode 127Sc, a third channel pattern 141*c*, a fourth sub-gate electrode 127Sd, a fourth channel pattern 141*d*, and a main gate electrode 127M may be sequentially disposed on the first sub-gate electrode 127Sa.

A gate insulation layer 162 may be disposed between the gate electrode 127 and the plurality of channel patterns 141*a*, 141*b*, 141*c*, and 141*d*. In addition, the gate insulation layer 162 may be disposed between each of the sub-gate electrodes 127Sa, 127Sb, 127Sc, and 127Sd and the source/drain pattern 170. The gate insulation layer 162 may cover side and bottom surfaces of the main gate electrode 127M.

A capping layer 540 may be disposed on the main gate electrode 127M. The capping layer 540 may cover an upper surface of the main gate electrode 127M. The capping layer 540 may cover the gate insulation layer 162 disposed on both sides of the main gate electrode 127M.

A spacer 570 may be disposed on both sides of the main gate electrode 127M. The spacer 570 may be formed to cover side surfaces of the main gate electrode 127M and the capping layer 540.

An insulation layer 620 may be disposed on the source/drain pattern 170. An upper surface of the insulation layer 620, an upper surface of the capping layer 540, and an upper surface of the spacer 570 may be planarized.

A contact member 720 electrically connected to the source/drain pattern 170 through the insulation layer 620 may be disposed on the source/drain pattern 170. The contact member 720 may be directly connected to the source/drain pattern 170. However, it is not limited thereto, and another conductive member may be further disposed between the contact member 720 and the source/drain pattern 170. For example, a conductive barrier to block or prevent diffusion of the contact member 720 may be further formed. The conductive barrier may be conformally formed using an atomic layer deposition (ALD) process, a chemical vapor deposition (CVD) process, or the like. The conductive barrier may include TiN, TaN, AlN, WN, or a combination thereof.

As another example, referring to FIG. 6, the integrated circuit element according to an example embodiment includes a substrate 100, and a P-channel FET (PFET) and an N-channel FET (NFET) stacked on the substrate 100.

A plurality of channel patterns 141 may be disposed on the active region AC of the substrate 100. The plurality of channel patterns 141 may include first channel patterns 141P and second channel patterns 141N. The first channel patterns 141P may be used as a channel of a P-channel FET (PFET), and the second channel patterns 141N may be used as a channel of an N-channel FET NFET. For example, five layers of channel patterns 141 may be disposed while being spaced apart from each other on the active region AC of the substrate 100. Among these channel patterns 141, three first channel patterns 141P disposed on the lower side may be used as a channel of a P-channel FET (PFET). The two second channel patterns 141N disposed on the upper side may be used as a channel of an N-channel FET (NFET). However, this is only one example, and the number of channel patterns 141 disposed on the active region AC, the number of first channel patterns 141P among them, and the number of second channel patterns 141N can be variously changed.

The P-channel FET (PFET) includes a first gate electrode 127P, and the plurality of first channel patterns 141P may be surrounded by the first gate electrode 127P. A gate insulation layer 162 may be disposed between the first channel patterns 141P and the first gate electrode 127P.

The N-channel FET (NFET) may include a second gate electrode 127N, and the plurality of second channel patterns 141N may be surrounded by the second gate electrode 127N. The gate insulation layer 162 may be disposed between the second channel patterns 141N and the second gate electrode 127N. A capping layer 540 may be positioned on the N-channel FET (NFET). An insulation layer 520 may be positioned between the P-channel FET (PFET) and the N-channel FET (NFET).

As such, by alternately stacking transistors of different conduction types three-dimensionally, the cell area may be reduced. The structure of stacking the N-channel FET (NFET) on the P-channel FET (PFET) has been described above, but is not limited thereto. A structure in which a P-channel FET (PFET) is stacked on an N-channel FET (NFET) is also possible.

Next, referring to FIG. 7, an integrated circuit element according to an example embodiment will be described.

Figure 7:
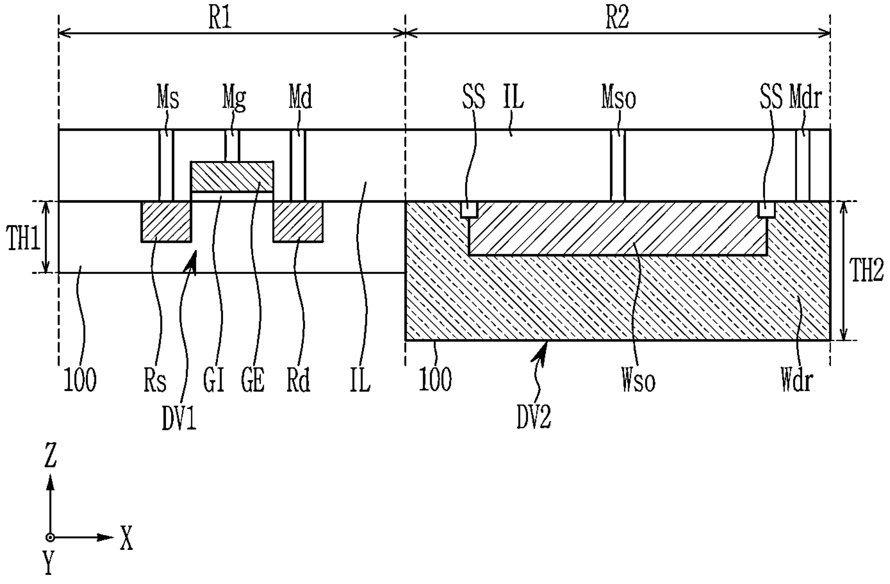
FIG. 7 is a cross-sectional view of an integrated circuit element according to an example embodiment.

FIG. 7 is a cross-sectional view of an integrated circuit element according to an example embodiment.

An embodiment shown in FIG. 7 is substantially the same part as the example embodiment shown in FIG. 1, the description thereof will be omitted and the difference will be mainly described. In addition, the same reference numeral is used for the same constituent elements as the preceding example embodiment. The present example embodiment is partially different from the previous embodiment in that a diode is disposed in a second region of a substrate.

As shown in FIG. 7, an integrated circuit element according to an example embodiment includes a substrate 100 including a first region R1 and a second region R2, a first element DV1 disposed in the first region R1 of the substrate 100, and a second element DV2 disposed in the second region R2 of the substrate 100.

Elements having different characteristics may be positioned in the first region R1 and the second region R2. For example, an element generating an electric field in a horizontal direction may be disposed in the first region R1, and an element generating an electric field in a vertical direction may be disposed in the second region R2.

The first element DV1 disposed in the first region R1 of the substrate 100 may be formed of, for example, a metal oxide semiconductor field effect transistor (MOSFET).

The second element DV2 disposed in the second region R2 of the substrate 100 may be formed of, for example, a vertical diode. The second element DV2 may include a first well region Wso and a second well region Wdr formed in the second region R2 of the substrate 100. The first well region Wso may be surrounded by the second well region Wdr. Lateral and bottom surfaces of the first well region Wso may be surrounded by the second well region Wdr. Accordingly, a width of the second well region Wdr may be wider than a width of the first well region Wso, and a depth of the second well region Wdr may be deeper than a depth of the first well region Wso.

Although not shown, the first well region Wso and the second well region Wdr may be formed as approximate quadrangles on a plane. However, the planar shapes of the first well region Wso and the second well region Wdr are not limited thereto and may be variously changed. For example, the first well region Wso and the second well region Wdr may have a substantially circular or elliptical shape on a plane. The first well region Wso may be surrounded by the second well region Wdr.

The first well region Wso may serve as a source, and the second well region Wdr may serve as a drain. The second element DV2 may be formed of a PN junction diode. The first well region Wso and the second well region Wdr may be doped as different types. For example, first well region Wso may be doped as P-type, and second well region Wdr may be doped as N-type. Conversely, the first well region Wso may be doped as N-type, and the second well region Wdr may be doped as P-type.

An element isolation region SS may be disposed between the first well region Wso and the second well region Wdr. The element isolation region SS may be formed to surround the first well region Wso on a plane. Although the element isolation region SS is shown to be formed only in a portion adjacent to an upper surface of the first well region Wso and the second well region Wdr, but is not limited thereto.

The element isolation region SS may be formed to a deeper position.

An insulation layer IL may be disposed above the first well region Wso and the second well region Wdr. Although the insulation layer IL disposed in the first region R1 and the second region R2 is shown as being integrally formed, but is not limited thereto. The insulation layer IL disposed in the first region R1 and the insulation layer IL disposed in the second region R2 may be separated (e.g., different) from each other and may be formed of different materials in different processes.

A hole passing through the insulation layer IL may be formed in the insulation layer IL, and wiring may be formed to fill the inside of the hole. For example, a source wire Mso connected to the first well region Wso may be formed through the insulation layer IL. A drain wire Mdr connected to the second well region Wdr may be formed through the insulation layer IL. Although not shown, an insulation layer, a wiring layer, and the like may be additionally formed on the source wire Mso and the drain wire Mdr.

In an integrated circuit element according to an example embodiment, the first region R1 and the second region R2 of the substrate 100 where first element DV1 and the second element DV2 having different characteristics are disposed, respectively, may have different thicknesses. A thickness TH2 of the second region R2 of the substrate 100 may be thicker than a thickness TH1 of the first region R1. An element that forms an electric field in a vertical direction may be disposed in the second region R2 of the substrate 100. Therefore, a bulk body may be formed and the performance of the second element DV2 may be improved by forming the thickness TH2 of the second region R2 of the substrate 100 sufficiently thick. An element forming an electric field in a horizontal direction may be disposed in the first region R1 of the substrate 100. Therefore, although the thickness TH1 of the first region R1 of the substrate 100 is formed relatively thin, the performance of the first element DV1 may not be affected. In addition, a through silicon via (TSV) penetrating the substrate 100 may be easily formed in order to use a back side power delivery network (BSPDN) method. That is, the efficiency of the device disposed in each region can be maximized or improved by forming the thickness of the substrate 100 differently according to the position.

Next, referring to FIG. 8 to FIG. 17, a method for manufacturing an integrated circuit element according to an example embodiment will be described.

FIG. 8 to FIG. 17 are process cross-sectional views according to the order of a manufacturing process according to an example embodiment.

Figure 8:
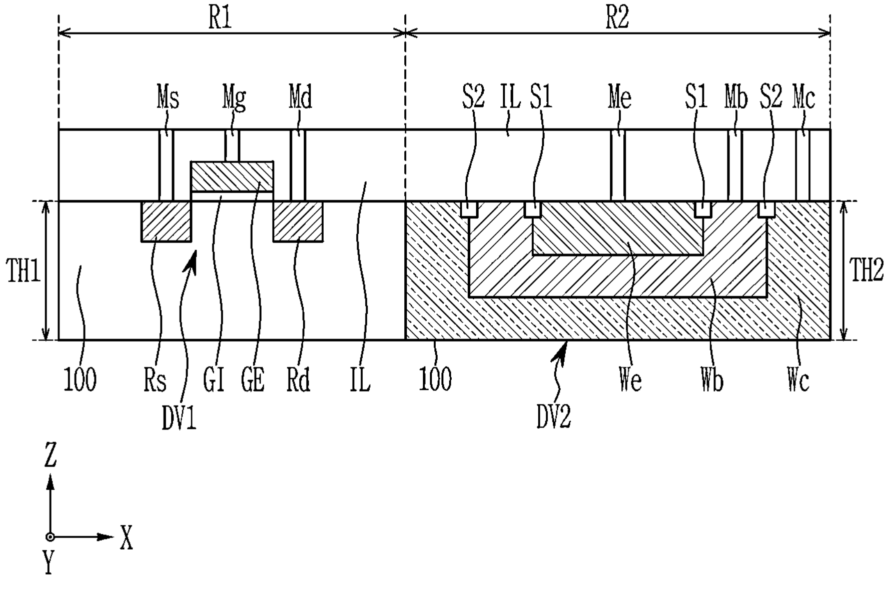
FIG. 8 to FIG. 17 are process cross-sectional views according to the order of a manufacturing process according to an example embodiment.

As shown in FIG. 8, a first element DV1 and a second element DV2 are formed on a substrate 100.

The substrate 100 may include a plurality of regions, and may include, for example, a first region R1 and a second region R2. Elements having different characteristics may be formed in the respective regions of the substrate 100. The first element DV1 may be formed in the first region R1, and the second element DV2 may be formed in the second region R2. The first element DV1 may be an element in which an electric field is formed in a horizontal direction, and the second element DV2 may be an element in which an electric field is formed in a vertical direction.

The first element DV1 disposed in the first region R1 of the substrate 100 may be formed of, for example, a metal oxide semiconductor field effect transistor (MOSFET). The first element DV1 may include a source region Rs and a drain region Rd spaced apart from each other, and a gate electrode GE disposed between the source region Rs and the drain region Rd. A gate insulation layer GI may be disposed between the substrate 100 and the gate electrode GE. For example, an insulating material layer and a conductive material layer may be sequentially accumulated on the substrate 100 and patterned to form the gate insulation layer GI and the gate electrode GE. Subsequently, source region Rs and drain region Rd can be formed through a process of doping predetermined portions positioned on both sides of the gate electrode GE.

The second element DV2 disposed in the second region R2 of the substrate 100 may be formed of, for example, a bipolar junction transistor (BJT). The second element DV2 may include a first well region We, a second well region Wb surrounding the first well region We, and a third well region Wc surrounding the second well region Wb. For example, a P-type doping process may be performed using a first mask pattern to form a third well region Wc. Next, an N-type doping process may be performed using a second mask pattern narrower than the first mask pattern to form the second well region Wb. Subsequently, the first well region We may be formed by performing a P-type doping process using a third mask pattern that is narrower than the second mask pattern. The case where the doping process is performed in the order of P-type/N-type/P-type has been described above, and thus a PNP-type transistor may be formed. However, it is not limited thereto, and the doping process may be performed in the order of N-type/P-type/N-type, and in this case, an NPN-type transistor may be formed.

A first element isolation region S1 may be formed between the first well region We and the second well region Wb, and a second element isolation region S2 may be formed between the second well region Wb and the third well region Wc. After forming the first element isolation region S1 and the second element isolation region S2, a doping process of the first well region We, the second well region Wb, and the third well region Wc may be performed. However, the present disclosure is not limited thereto, and the first element isolation region S1 and the second element isolation region S2 may be formed after performing a doping process of the first well region We, the second well region Wb, and the third well region Wc.

An insulation layer IL is formed using an insulating material on the substrate 100 on which the first element DV1 and the second element DV2 are formed. The insulation layer IL may be patterned to form a hole exposing at least a part of the first element DV1 and the second element DV2. For example, at least a part of the source region Rs, at least a part of the drain region Rd, and at least a part of the gate electrode GE of the first element DV1 may be exposed by the hole. In addition, at least a part of the first well region We, at least a part of the second well region Wb, and at least a part of the third well region Wc of the second element DV2 may be exposed.

Subsequently, wiring may be formed inside the hole using a metal material. For example, a gate wire Mg connected to the gate electrode GE of the first element DV1, a first wire Ms connected to the source region Rs, and a second wire Md connected to the drain region Rd may be formed. In addition, an emitter wire Me connected to the first well region We of the second element DV2, a base wire Mb connected to the second well region Wb, and a collector wire Mc connected to the third well region Wc may be formed. Although not shown, an insulation layer, a wiring layer, and the like may be additionally formed on the wires connected to the first element DV1 and the wiring connected to the second element DV2.

In this case, a thickness of the substrate 100 may be constant. A thickness TH1 of the first region R1 and a thickness TH2 of the second region R2 of the substrate 100 may be substantially the same. For example, the thickness TH1 of the first region R1 and the thickness TH2 of the second region R2 of the substrate 100 may be about 1 μm.

Figure 9:
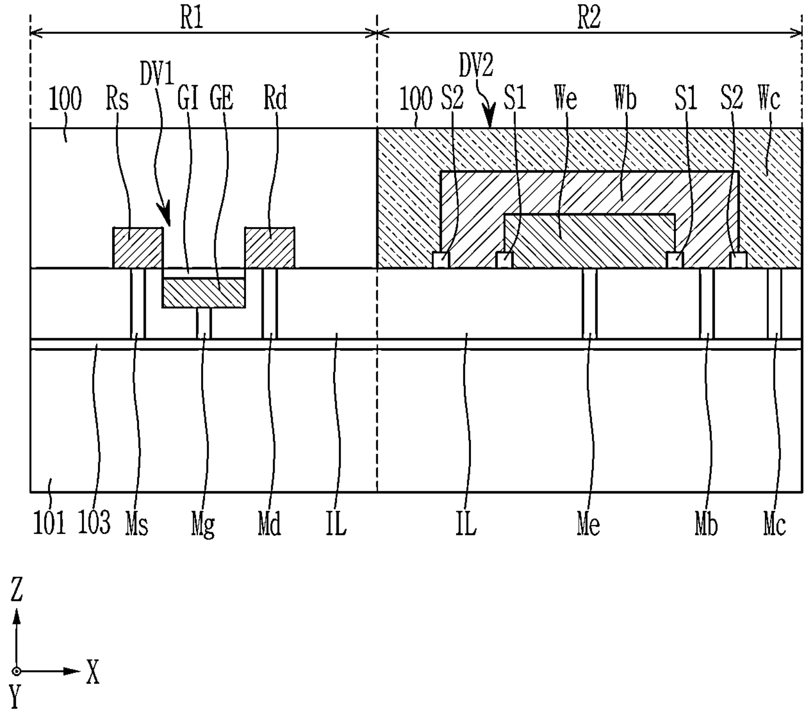

As shown in FIG. 9, a carrier substrate 101 is prepared. For example, the carrier substrate 101 may include a semiconductor material such as glass, plastic, a ceramic material, or silicon.

The substrate 100 may be placed on the carrier substrate 101 and the substrate 100 may be attached to the carrier substrate 101. In this case, the top and bottom of the substrate 100 may be turned over. That is, the upper surface of the substrate 100 may be positioned such that it faces the carrier substrate 101. Therefore, the substrate 100 may be disposed with the bottom surface facing upward. An adhesive member 103 may be disposed between the substrate 100 and the carrier substrate 101. The substrate 100 may be easily attached to the carrier substrate 101 by the adhesive member 103. Although the adhesive member 103 is shown as being in contact with the insulation layer IL, the gate wire Mg, the first wire Ms, the second wire Md, the emitter wire Me, the base wire Mb, and the collector wire Mc, but is not limited thereto. In fact, other layers may be disposed between the adhesive member 103 and these wires.

Figure 10:
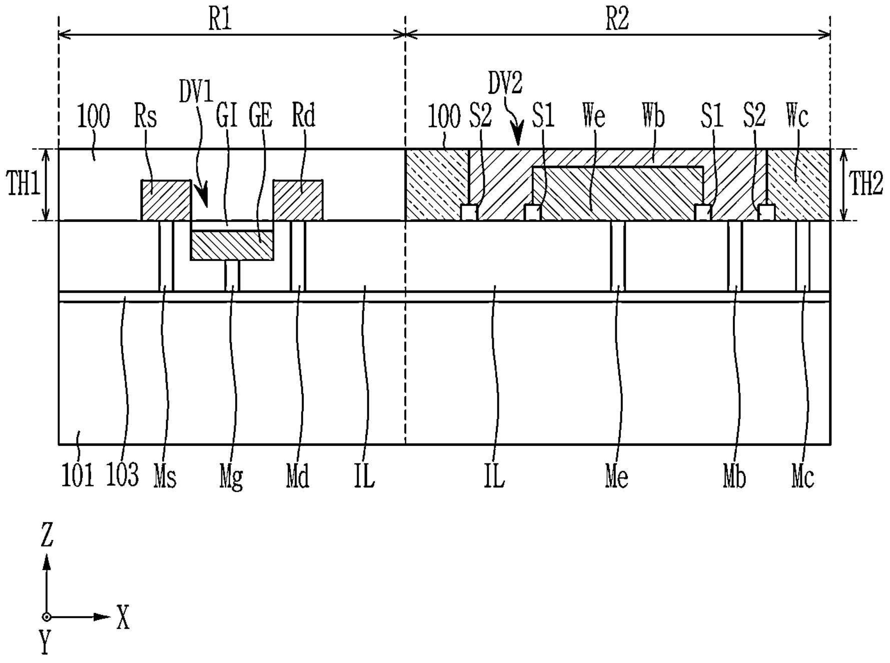

As shown in FIG. 10, at least a part of the substrate 100 may be removed by performing a wafer thinning process. The wafer thinning process may include a grinding process, a wet etching process, a chemical mechanical polishing (CMP) process, and the like. At least a portion of the substrate 100 may be removed by at least one of these processes. For example, wafer thinning may be carried out by a single grinding process, or may be carried out by performing a wet etching process after a grinding process. In addition, a cleaning process may additionally proceed.

The wafer thinning process may be performed on the bottom surface of the substrate 100, and a portion corresponding to a desired (or alternatively, predetermined) thickness may be removed from the bottom surface of the substrate 100. For example, the thickness of the substrate 100 before proceeding with the wafer thinning process may be about 1 μm as a whole. After the wafer thinning process, the thickness of the substrate 100 may be about 200 nm or more and about 300 nm or less. That is, the thickness of the substrate 100 may be reduced by about half or more by the wafer thinning process. In this case, a thickness TH1 of the first region R1 of the substrate 100 and a thickness TH2 of the second region R2 may be substantially the same. Accordingly, the thickness TH1 of the first region R1 and the thickness TH2 of the second region R2 of the substrate 100 may be greater than or equal to about 200 nm and less than or equal to about 300 nm.

At least a part of the second well region Wb and the third well region Wc may be removed by the wafer thinning process. The thickness of the second well region Wb may decrease, and the thickness of the third well region Wc may decrease. The portion of the third well region Wc that overlaps with the second well region Wb may be removed. Accordingly, the second well region Wb does not overlap with the third well region Wc in a direction perpendicular to the substrate 100.

Figure 11:
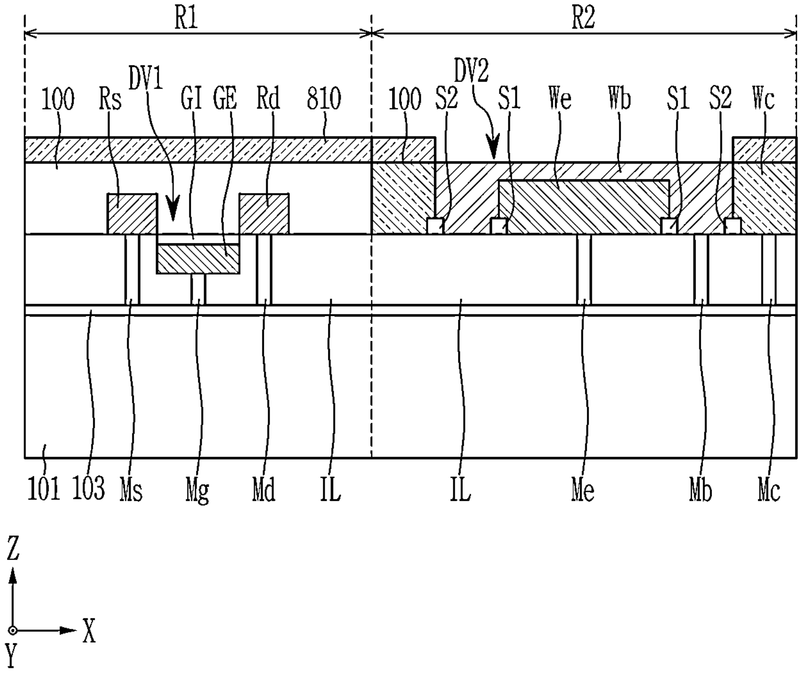

As shown in FIG. 11, a first hard mask pattern 810 is formed on the bottom surface of the substrate 100. The first hard mask pattern 810 may entirely cover the first region R1 of the substrate 100. The first hard mask pattern 810 may cover a part of second region R2 of substrate 100 and may not cover other parts. The first hard mask pattern 810 may have an open portion corresponding to the second well region Wb.

Figure 12:
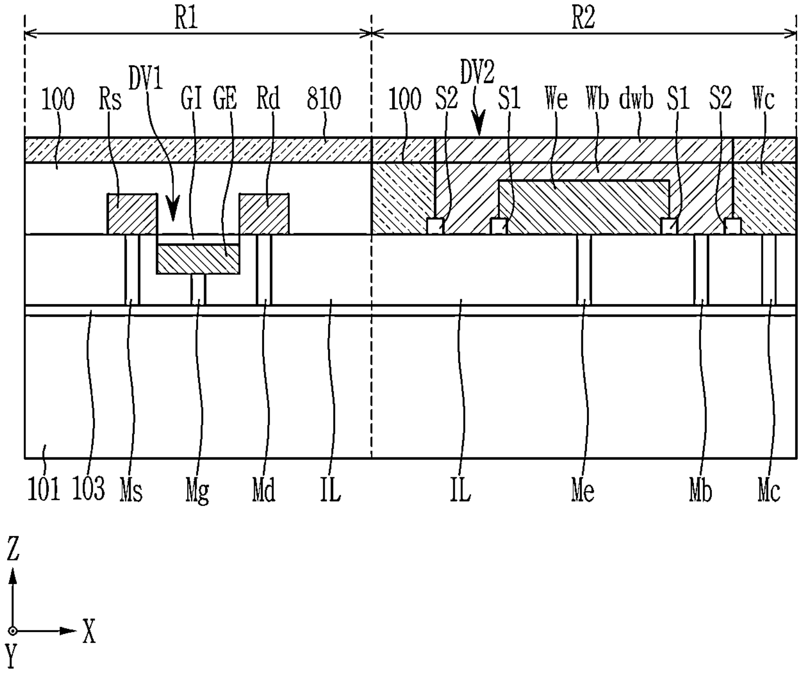

As shown in FIG. 12, a silicon material layer is deposited on the bottom surface of the substrate 100, and a dummy second well region dwb is formed by performing a planarization process.

The silicon material layer may be disposed on the first hard mask pattern 810 and may be disposed to fill an open portion of the first hard mask pattern 810. In this case, the silicon material layer may be deposited in a doped form. For example, an N-type doped silicon material layer may be formed by depositing silicon together with an N-type doping material.

The upper surface of the silicon material layer may be planarized using a chemical mechanical polishing process. Accordingly, a portion of the silicon material layer positioned on the first hard mask pattern 810 may be removed. A portion of the silicon material layer remains within the open portion of the first hard mask pattern 810 to form a dummy second well region dwb. A thickness of the dummy second well region dwb may correspond to a thickness of the first hard mask pattern 810. The thickness of the first hard mask pattern 810 may be about 150 nm or more and about 200 nm or less. The thickness of the dummy second well region dwb may be greater than or equal to about 150 nm and less than or equal to about 200 nm. The dummy second well region dwb may contact the second well region Wb, and they may be integrally formed. As the dummy second well region dwb is formed, the thickness of the second well region Wb reduced by the wafer thinning process can be restored.

Figure 13:
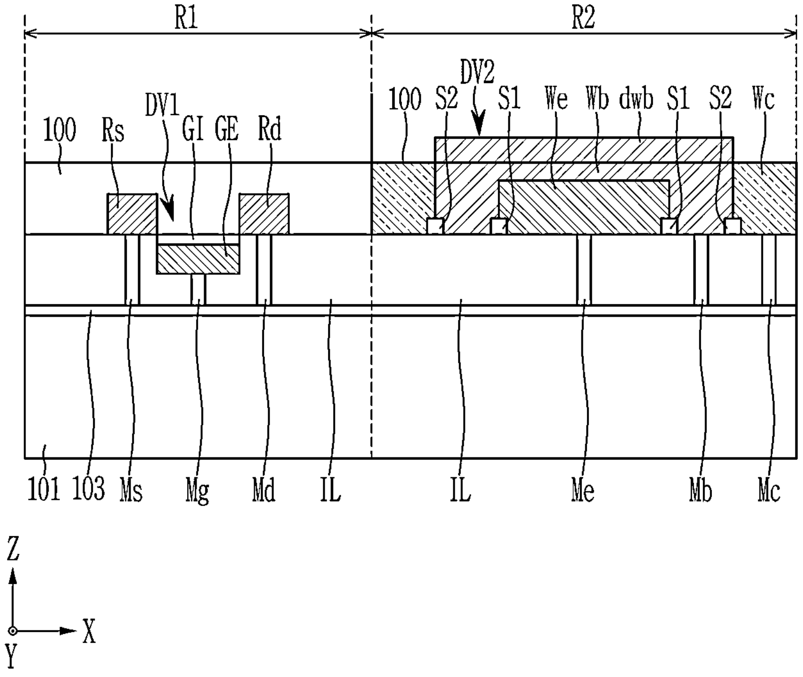

As shown in FIG. 13, the first hard mask pattern 810 is removed. The first hard mask pattern 810 may be removed using an etching process, an ashing process, a strip process, or the like. In the process of removing the first hard mask pattern 810, the dummy second well region dwb remains and forms a part of the substrate 100 without being removed.

Figure 14:
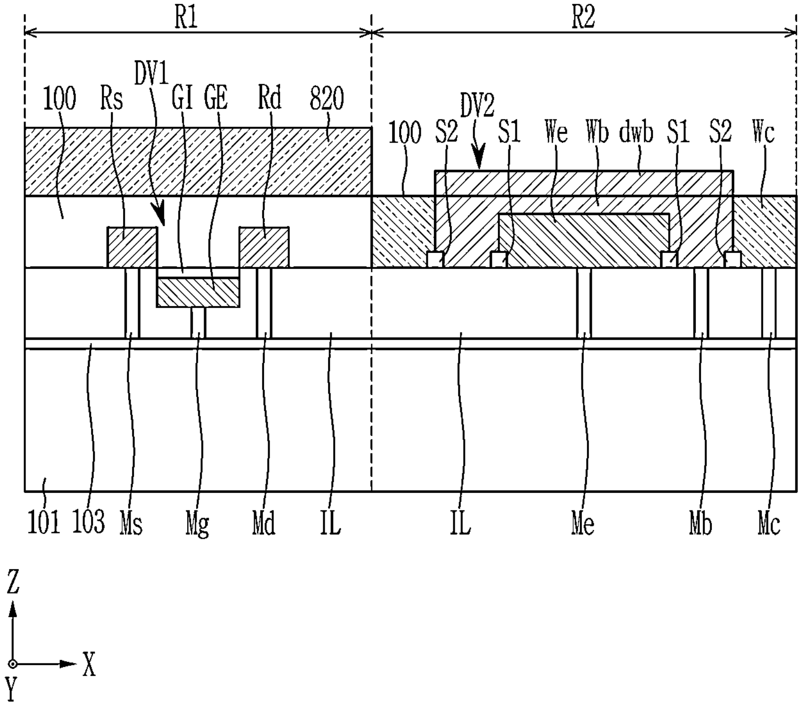

As shown in FIG. 14, a second hard mask pattern 820 is formed on the bottom surface of the substrate 100. The second hard mask pattern 820 may entirely cover the first region R1 of the substrate 100. The second hard mask pattern 820 may cover a part of second region R2 of the substrate 100 and may not cover other parts. The second hard mask pattern 820 may have an open portion corresponding to the third well region Wc. FIG. 14 shows only a portion corresponding to the third well region Wc of the second region R2, but the second region R2 may further include other portions other than the third well region Wc. Accordingly, the second hard mask pattern 820 may cover a portion of the second region R2 excluding the third well region Wc.

A thickness of the second hard mask pattern 820 may be thicker than that of the dummy second well region dwb. The thickness of the second hard mask pattern 820 may be thicker than the thickness of the first hard mask pattern 810. The thickness of the second hard mask pattern 820 may be greater than or equal to about 250 nm and less than or equal to about 300 nm.

Figure 15:
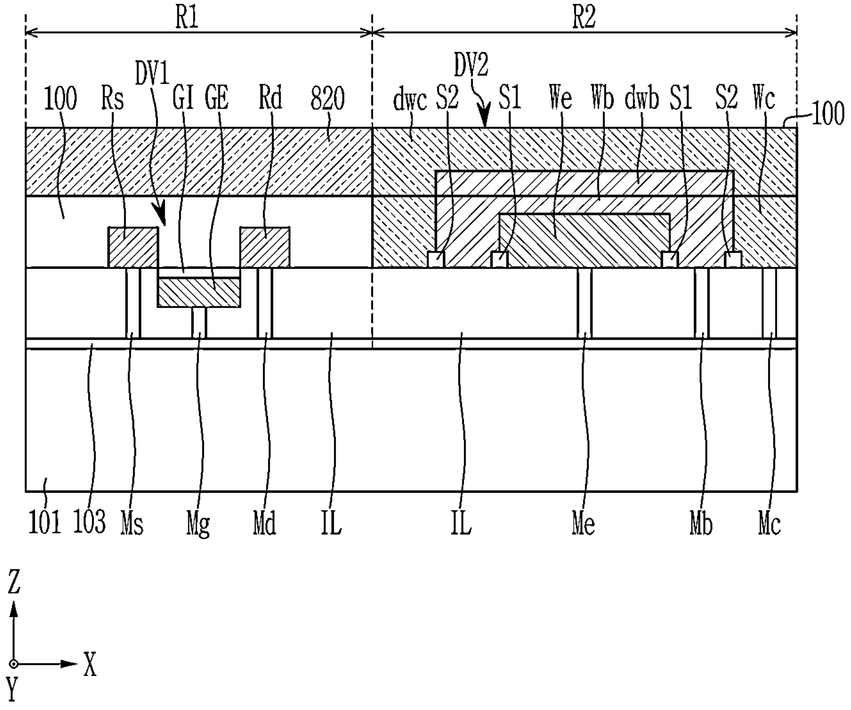

As shown in FIG. 15, a silicon material layer is deposited on the bottom surface of the substrate 100, and the planarization process is performed to form a dummy third well region dwc.

The silicon material layer may be disposed on the second hard mask pattern 820, and may be disposed to fill an open portion of the second hard mask pattern 820. In this case, the silicon material layer may be deposited in a doped form. For example, a P-type doped silicon material layer can be formed by depositing silicon together with a P-type doping material.

The upper surface of the silicon material layer may be planarized using a chemical mechanical polishing process. Accordingly, a portion of the silicon material layer positioned on the second hard mask pattern 820 may be removed. A silicon material layer remains in the open portion of the second hard mask pattern 820 to form the dummy third well region dwc. A thickness of the dummy third well region dwc may be greater than or equal to about 80 nm and less than or equal to about 120 nm. For example, the thickness of the dummy third well region dwc may be about 100 nm. In this case, the thickness of the dummy third well region dwc may mean a thickness of a portion of the dummy third well region dwc that overlaps with the dummy second well region dwb. The sum of the thickness of the dummy second well region dwb and the thickness of the dummy third well region dwc may be greater than or equal to about 250 nm and less than or equal to about 300 nm. The dummy third well region dwc may contact the third well region Wc, and they may be integrally formed. As the dummy third well region dwc is formed, the thickness of the third well region Wc reduced by the wafer thinning process may be restored.

Figure 16:
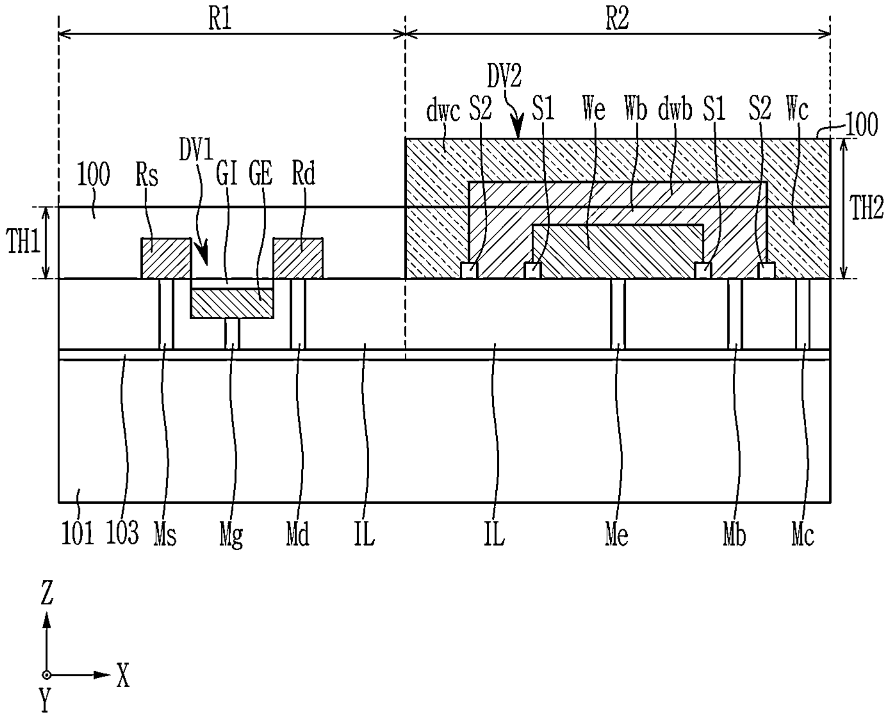

As shown in FIG. 16, the second hard mask pattern 820 is removed. The second hard mask pattern 820 can be removed using an etching process, an ashing process, a strip process, or the like. In the process of removing the second hard mask pattern 820, the dummy third well region dwc remains and forms a part of the substrate 100 without being removed.

As such, the thickness of the second region R2 of the substrate 100 can be increased by forming the dummy second well region dwb and the dummy third well region dwc on the bottom surface of the second region R2 of the substrate 100. The thickness TH1 of first region R1 of the substrate 100 and the thickness TH2 of the second region R2 may be different. The thickness TH2 of the second region R2 of the substrate 100 may be thicker than the thickness TH1 of the first region R1. The thickness TH2 of the second region R2 of the substrate 100 may be about 500 nm or more and about 1 μm or less.

Figure 17:
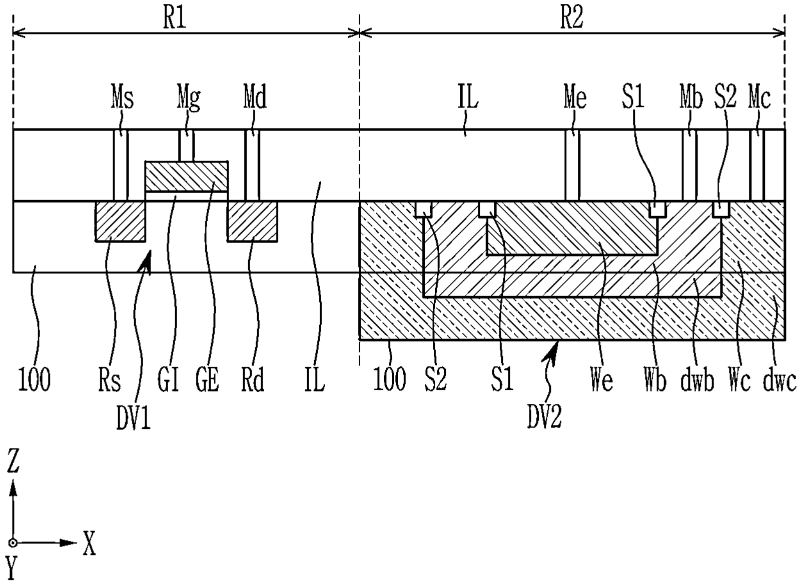

As shown in FIG. 17, a carrier substrate 101 is removed. The carrier substrate 101 may be separated from constituent elements disposed on the substrate 100 by performing a process of relaxing the adherence of the adhesive member 103. The adhesive member 103 is removed together with the carrier substrate 101, and the substrate 100 is turned upside down again. Therefore, the upper surface of the substrate 100 can be positioned such that it faces upward.

Next, referring to FIG. 18 to FIG. 21, characteristics of the second element according to the thickness change of the substrate in the integrated circuit element according to an example embodiment will be described.

Figure 18:
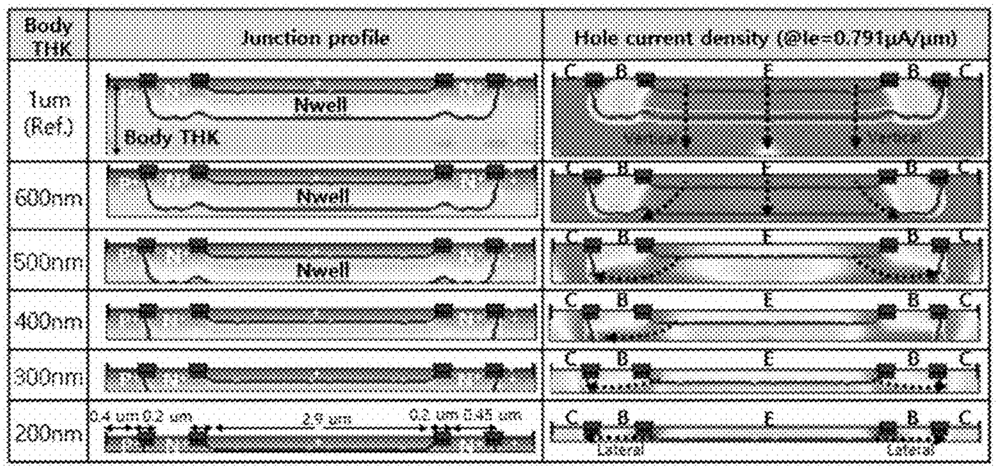
FIG. 18 shows a junction profile and hole current density according to the thickness change of the substrate in the integrated circuit element, according to an example embodiment.
Figure 19:
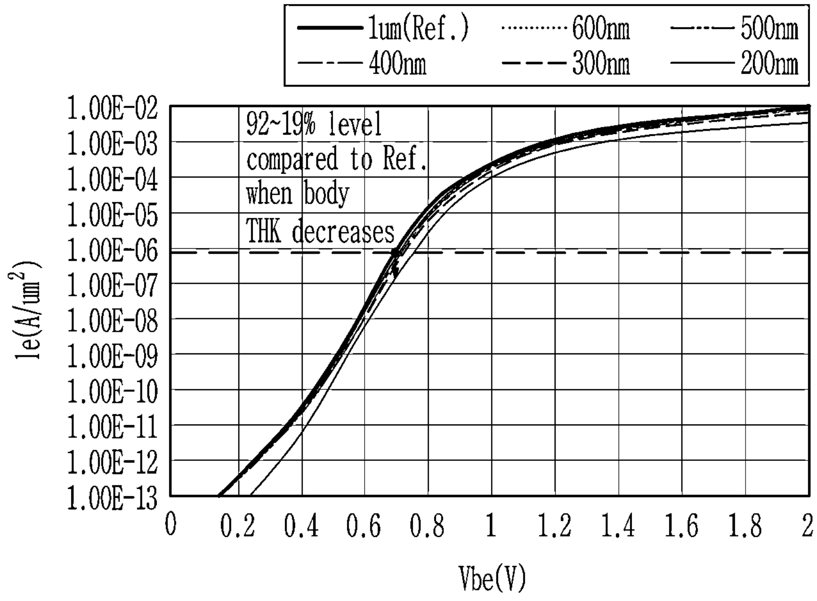
FIG. 19 shows the change in emitter current Ie according to the thickness change of the substrate in the integrated circuit element, according to an example embodiment.
Figure 20:
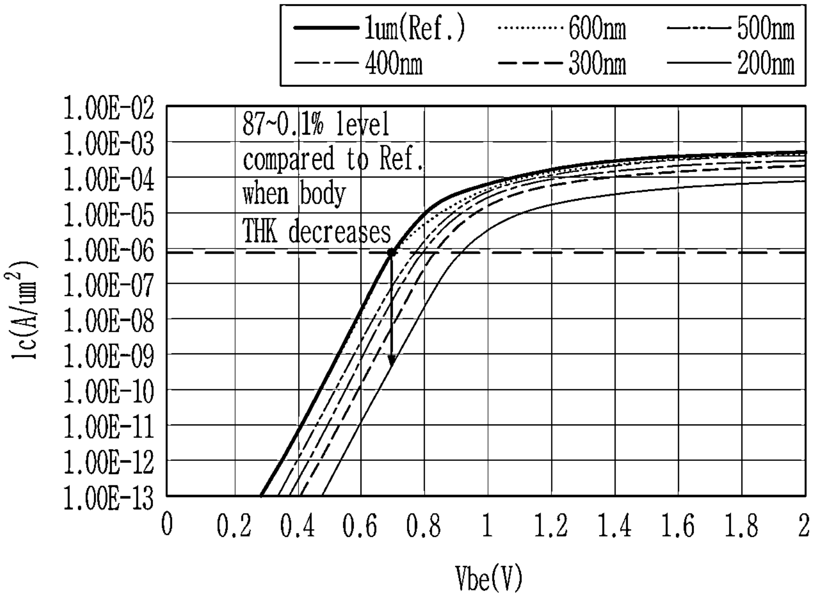
FIG. 20 shows the change of collector current Ic according to the change of substrate thickness in the integrated circuit element, according to an example embodiment.
Figure 21:
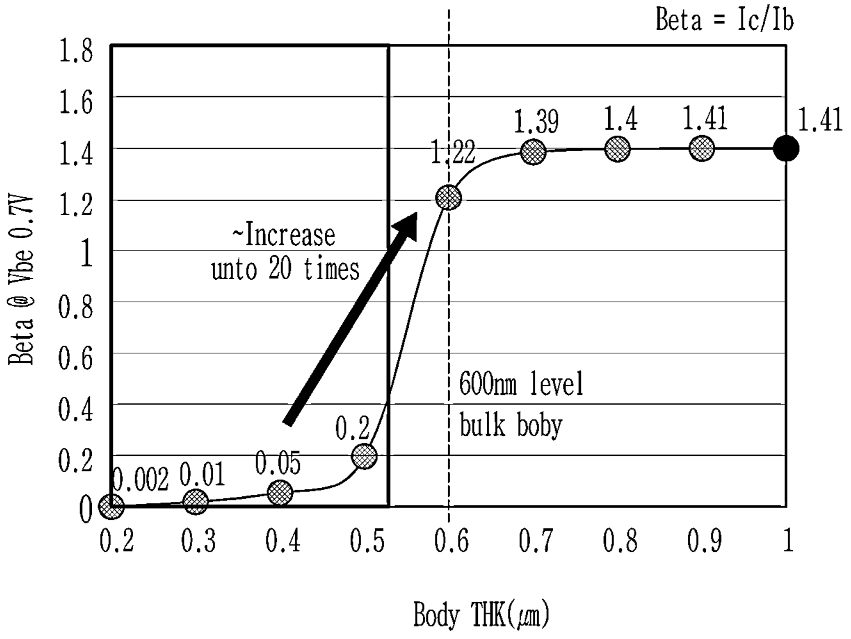
FIG. 21 shows a current gain (Beta) according to the thickness change of the substrate in the integrated circuit element, according to an example embodiment.

FIG. 18 to FIG. 21 show the characteristics of the second element of the integrated circuit element according to an example embodiment. FIG. 18 shows a junction profile and hole current density according to the thickness change of the substrate in the integrated circuit element according to an example embodiment. FIG. 19 shows the change in emitter current Ie according to the thickness change of the substrate in the integrated circuit element according to an example embodiment. FIG. 20 shows the change of collector current Ic according to the change of substrate thickness in the integrated circuit element according to an example embodiment. FIG. 21 shows a current gain (Beta) according to the thickness change of the substrate in the integrated circuit element according to an example embodiment.

As shown in FIG. 18, when a thickness of the substrate in a structure in which the N-type well region is disposed to surround side and bottom surfaces of the P-type well region, and the P-type well region is disposed to surround side and bottom surface of the N-type well region is formed thick enough to about 1 μm, it can be confirmed that the electric field is stably formed in the vertical direction. When the thickness of the substrate is about 600 nm, the thickness of the P-type well region disposed below the N-type well region is significantly reduced, and it can be confirmed that the electric field in the vertical direction is distorted and moves in the horizontal direction at both edges. When the thickness of the substrate is about 500 nm, most of the P-type well region disposed below the N-type well region is removed, and when the thickness of the substrate is about 400 nm, the thickness of the N-type well region may be thinned. When the thickness of the substrate reaches about 300 nm, the thickness of the N-type well region is significantly reduced, and when the thickness of the substrate is about 200 nm, most of the N-type well region can be removed. As the thickness of the substrate decreases, the electric field in the vertical direction gradually decreases and then disappears, and the electric field in the horizontal direction remains only at the edges on both sides.

As shown in FIG. 19, as a base-emitter voltage Vbe increases, the emitter current Ie may increase. In this case, it can be confirmed that the emitter current Ie tends to decrease when the thickness of the substrate decreases. Compared to the case where the thickness of the substrate is about 1 μm, as the thickness of the substrate decreases, the emitter current Ie decreases to about 92% to about 19%.

As shown in FIG. 20, as the base-emitter voltage Vbe increases, the collector current Ic may increase. In this case, it can be confirmed that the collector current Ic tends to decrease as the thickness of the substrate decreases. Compared to the case where the thickness of the substrate is about 1 μm, the collector current Ic decreases to about 87% to about 0.1% as the thickness of the substrate decreases. For example, when the thickness of the substrate is about 300 nm, the collector current Ic can be degraded by about 98% to about 99% compared to the case when the thickness of the substrate is about 1 μm.

As shown in FIG. 21, it can be confirmed that the current gain Beta tends to decrease when the thickness of the substrate decreases. The current gain Beta means a ratio of collector current Ic to the base current Ib. When the thickness of the substrate is about 1 μm, the current gain Beta may be about 1.41. When the thickness of the substrate decreases to about 600 nm, the current gain Beta decreases to about 1.22. When the thickness of the substrate decreases to about 500 nm, the current gain Beta rapidly decreases to about 0.2. When the thickness of the substrate decreases to about 300 nm, the current gain Beta decreases to about 0.01.

As the thickness of the substrate decreases, the electric field in the vertical direction is removed, and thus the collector current Ic and the current gain Beta may decrease. In the integrated circuit element according to an example embodiment, the collector current Ic may be increased, and the current gain Beta may be increased by selectively increasing the thickness of the second region of the substrate on which the second element is positioned. For example, by increasing the thickness of the substrate from about 400 nm to about 600 nm, the current gain Beta may be improved by about 20 times or more.

Although some example embodiments have been described in detail above, the scope of the present inventive concepts are not limited thereto, and various modifications and improvements made by those skilled in the art using the present inventive concepts defined in the following claims.

What is claimed is:

1. An integrated circuit element comprising:

a substrate including a first region and a second region;

a first element in the first region of the substrate and configured to generate an electric field in a horizontal direction; and a second element in the second region of the substrate and configured to generate an electric field in a vertical direction;

a metal layer on the first region of the substrate; and a through via connected to the metal layer and penetrating the first region of the substrate, wherein a thickness of the second region is thicker than a thickness of the first region.

2. The integrated circuit element of claim 1, wherein the first element is a metal oxide semiconductor field effect transistor.

3. The integrated circuit element of claim 2, wherein the first element includes at least one of a fin field effect transistor (FinFET), a gate all around (GAA) transistor, a multi bridge channel field effect transistor (MBCFET), a three dimensional stack field effect transistor (3DSFET), and a complementary field effect transistor (CFET).

4. The integrated circuit element of claim 3, wherein the first element comprises:

a source region and a drain region in the first region of the substrate and spaced apart from each other;

a gate electrode on the first region of the substrate and between the source region and the drain region; and a gate insulation layer between the substrate and the gate electrode.

5. The integrated circuit element of claim 4, wherein the first element is configured to move a carrier in a direction parallel to the substrate between the source region and the drain region.

6. The integrated circuit element of claim 1, wherein the second element includes at least one of a bipolar junction transistor, a PN junction diode, and an electrostatic discharge element.

7. The integrated circuit element of claim 6, wherein the second element includes a PNP-type transistor or an NPN-type transistor.

8. The integrated circuit element of claim 7, wherein the second element comprises:

a first well region;

a second well region surrounding side and bottom surfaces of the first well region; and a third well region surrounding side and bottom surfaces of the second well region, and the second well region is doped with a different material than the first well region and the third well region.

9. The integrated circuit element of claim 8, wherein the second element is configured to move a carrier in a direction perpendicular to an upper surface of the substrate along the first well region, the second well region, and the third well region.

10. The integrated circuit element of claim 8, wherein the second element further comprises:

a first element isolation region between the first well region and the second well region; and a second element isolation region between the second well region and the third well region.

11. The integrated circuit element of claim 1, wherein a thickness of the first region of the substrate is 200 nm or more and 300 nm or less, and a thickness of the second region of the substrate is greater than 500 nm and less than 1 μm.

12. The integrated circuit element of claim 1, wherein the through via is configured to receive a power voltage or a ground voltage.

13. An integrated circuit element comprising:

a substrate including a first region and a second region;

a first element on the first region of the substrate;

a second element on the second region of the substrate, a metal layer in the first region of the substrate; and a through via connected to the metal layer and penetrating the first region of the substrate, wherein the first region and the second region of the substrate have different thicknesses, the first element is a metal oxide semiconductor field effect transistor, and the second element includes at least one of a bipolar junction transistor, a PN junction diode, and an electrostatic discharge element.

* * * * *